(12) United States Patent
Lee et al.

(10) Patent No.: US 6,610,924 B1
(45) Date of Patent: Aug. 26, 2003

(54) SEMICONDUCTOR PACKAGE

(75) Inventors: Shih-Chang Lee, Kaohsiung Hsien; Su Tao, Kaohsiung, both of (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 338 days.

(21) Appl. No.: 09/625,023

(22) Filed: Jul. 25, 2000

(51) Int. Cl.$^7$ ................................. H01L 23/02
(52) U.S. Cl. ............... 174/52.4; 174/52.2; 257/670; 257/676
(58) Field of Search ............... 174/52.4, 52.2; 257/666, 670, 671, 676; 361/773

(56) References Cited

U.S. PATENT DOCUMENTS 4,855,807 A * 8/1989 Yamaji et al. ............ 257/670
5,894,108 A    4/1999 Mostafazadeh et al. .... 174/52.4
6,177,718 B1 * 1/2001 Kozono ..................... 257/666

* cited by examiner

*Primary Examiner*—Anthony Dinkins
*Assistant Examiner*—Hung V Ngo
(74) *Attorney, Agent, or Firm*—Dykema Gossett PLLC

(57) ABSTRACT

A semiconductor package has a semiconductor chip disposed on a die pad and electrically connected to a plurality of leads arranged around the die pad. There are a plurality of tie bars connected to the die pad. Each tie bar extends from a corner of the die pad to a corresponding corner of the leadless semiconductor package. The semiconductor chip, the leads and the tie bars are encapsulated in a package body wherein the backside surface of the leads is exposed from the lower surface of the semiconductor package. All the tie bars of the semiconductor package are embedded in the package body except a part of at least one tie bar or an odd number of tie bars exposed from the lower surface of the semiconductor package to work as an indicial mark.

14 Claims, 5 Drawing Sheets

SEMICONDUCTOR PACKAGE

BACKGROUND OF THE INVENTION

1. Field of the Invention

This invention is related to a lead frame package, and more specifically to a leadless semiconductor package.

2. Description of the Related Art

Lead frame packages has been used for a long period of time in the IC packaging history mainly because of its low manufacturing cost and high reliability. However, as integrated circuits products move its endless pace toward both faster and smaller in size, the traditional lead frame packages become gradually obsolete for some high performance-required packages. Thus BGA (Ball Grid Array Packages) and CSP (Chip Scale Package) have emerged and become increasingly popular as a new packaging choice. The former was widely used in IC chips that have higher I/Os and need better electrical and thermal performance than the conventional packages, for examples, CPU and graphic chips. The latter has been widely used in mobile products of which the footprint, package profile, package weight are major concerns.

However, the lead frame package still remains its market share as a cost-effective solution for low I/O ICs. Traditional lead frame package has its limit of providing a chip scale and low profile solution due to the long inner leads and outer leads. Therefore, the semiconductor packaging industry develops a leadless package without outer leads such that both foot print and package profile can be greatly reduced. FIG. 1 shows a bottom view of a leadless package 100 wherein the leads 110*a* are disposed at the bottom of the package as compared to the conventional gull-wing or J-leaded type package. The die pad 110*b* of the leadless package 100 is exposed from the bottom of the package thereby providing better power dissipation. Typically, there are four tie bars 100*c* connected to the die pad 110*b*.

Due to elimination of the outer leads, leadless packages feature lower profile and light weight. Furthermore, due to the lead length reduction, the corresponding reduction in the resistance, conductance and capacitance make the leadless package 100 very suitable for RF (radio-frequency) product packages operating in several GHz to tens of GHz frequency range. It's also a cost-effective package due to its use of existing BOM (bill of materials). All the above-mentioned properties make the current leadless packages very suitable for telecommunication products such as cellular phones, portable products such as PDA (personal digital assistant), digital cameras, and IA (Information Appliance).

Conventional leadless packaging process comprises the following steps.

Firstly, a polyimide (PI) tape was attached to the bottom of a lead frame, this is to prevent the mold flash problem in the molding process. Typically, a lead frame (denoted as 105 in FIG. 2) for used in the MAP (mold array package) molding process comprises a plurality of units 110 each including a plurality of leads 110*a* arranged at the periphery of a die pad 110*b*. Each die pad 10*b* is connected to the lead frame 105 by four tie bars 110*c*.

Then, referring to FIG. 3, IC chips 120 are attached to the die pads 110*b* using silver epoxy, and the epoxy is cured after die attach. After that, a regular wire-bonding process is used to make interconnections between the silicon chips 120 and the leads 110*a* of the lead frame 105. After wire bonding, the lead frame 105 and the chips 120 attached thereon are encapsulated in a package body 130. Typically, a MAP molding process was used to accomplish this encapsulation. The PI tape is then removed after the molding process.

The molded product is then marked with either laser or traditional ink. Finally, postmold curing and singulation steps were conducted to complete the packaging process. Typically, the mark either formed by laser or ink printing is adapted to be identified by a recognition system which provides all the coordinates of the leads needed in the following testing or trouble-shooting process. Since there is no recognizable mark at the bottom of the leadless package before the marking step, it is hard to avoid human error during manual operation. Furthermore, the mark formed by laser or ink printing may become faint due to scratching in the delivery thereby changing the contour of the mark such that it becomes unrecognizable.

SUMMARY OF THE INVENTION

It is therefore an object of the present invention to overcome the problems and disadvantages associated with the above-described technique.

It is another object of the present invention to provide a leadless semiconductor package comprising a plurality of tie bars connecting to a die pad wherein the package is characterized in that all the tie bars are embedded in a package body except a part of at least one tie bar or an odd number of tie bars exposed from the lower surface of the package to work as an indicial mark.

It is another object of the present invention to provide a leadframe for use in forming leadless semiconductor packages, the lead frame comprising a plurality of units each adapted for use in packaging a semiconductor chip, wherein the lead frame is characterized in that each unit is provided with at least one tie bar or an odd number of tie bars each having a bulge portion work as an indicial mark thereby significantly reducing human error during packaging steps performed before the marking step.

In accordance with the above listed and other objects we discloses- a leadless semiconductor package mainly comprising a semiconductor chip disposed on a die pad and electrically connected to a plurality of leads arranged around the die pad. There are a plurality of tie bars connected to the die pad. Each tie bar extends from a corner of the die pad to a corresponding corner of the leadless semiconductor package. The semiconductor chip, the leads and the tie bars are encapsulated in a package body wherein the backside surface of the leads is exposed from the lower surface of the leadless semiconductor package. The leadless semiconductor package of the present invention is characterized in that all the tie bars are embedded in the package body except a part of at least one tie bar or an odd number of tie bars exposed from the lower surface of the leadless semiconductor package to work as an indicial mark.

The present invention further provides a lead frame for use in forming leadless semiconductor packages. The lead frame comprises a plurality of units each having four corners. Each unit includes a die pad adapted for receiving a semiconductor chip and a plurality of leads arranged at the periphery of the die pad. Each of the die pads is connected to the lead frame by a plurality of tie bars wherein at least one tie bar or an odd number of tie bars each has a bulge portion formed with a thickness substantially equal to the thickness of the die pad and the leads. The thickness of all tie bars of each unit is substantially less than the thickness of the lead frame except the bulge portion or bulge portions thereof whereby the bulge portion or bulge portions work as an indicial mark thereby significantly reducing human error during packaging steps performed before the marking step.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
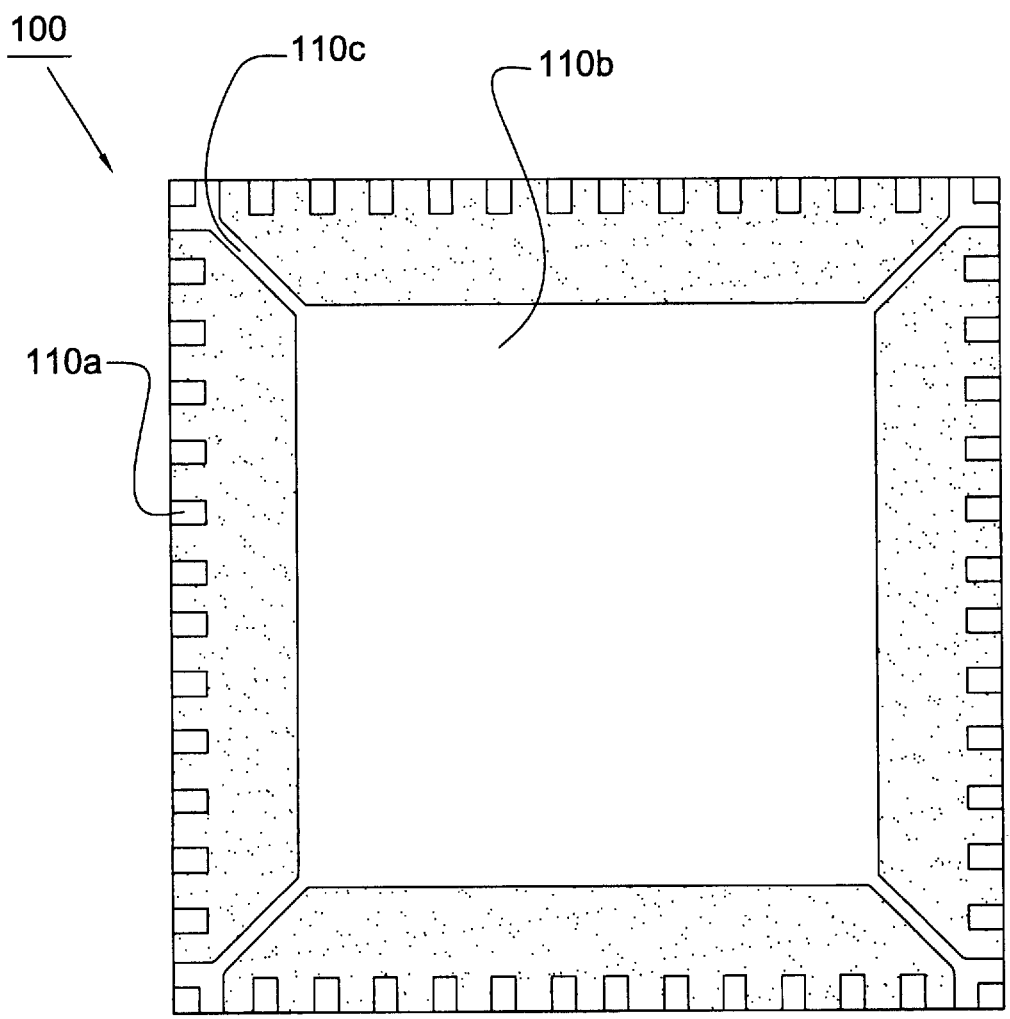
FIG. 1 is a bottom view of a conventional leadless package.
Figure 3:
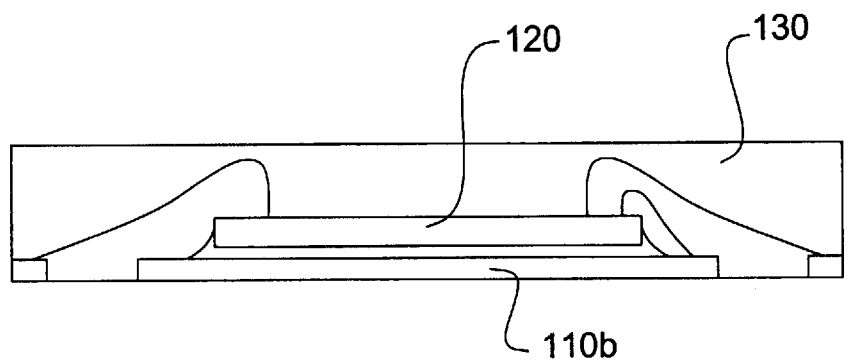
FIG. 3 is a cross sectional view of the conventional leadless package of FIG. 1.
Figure 2:
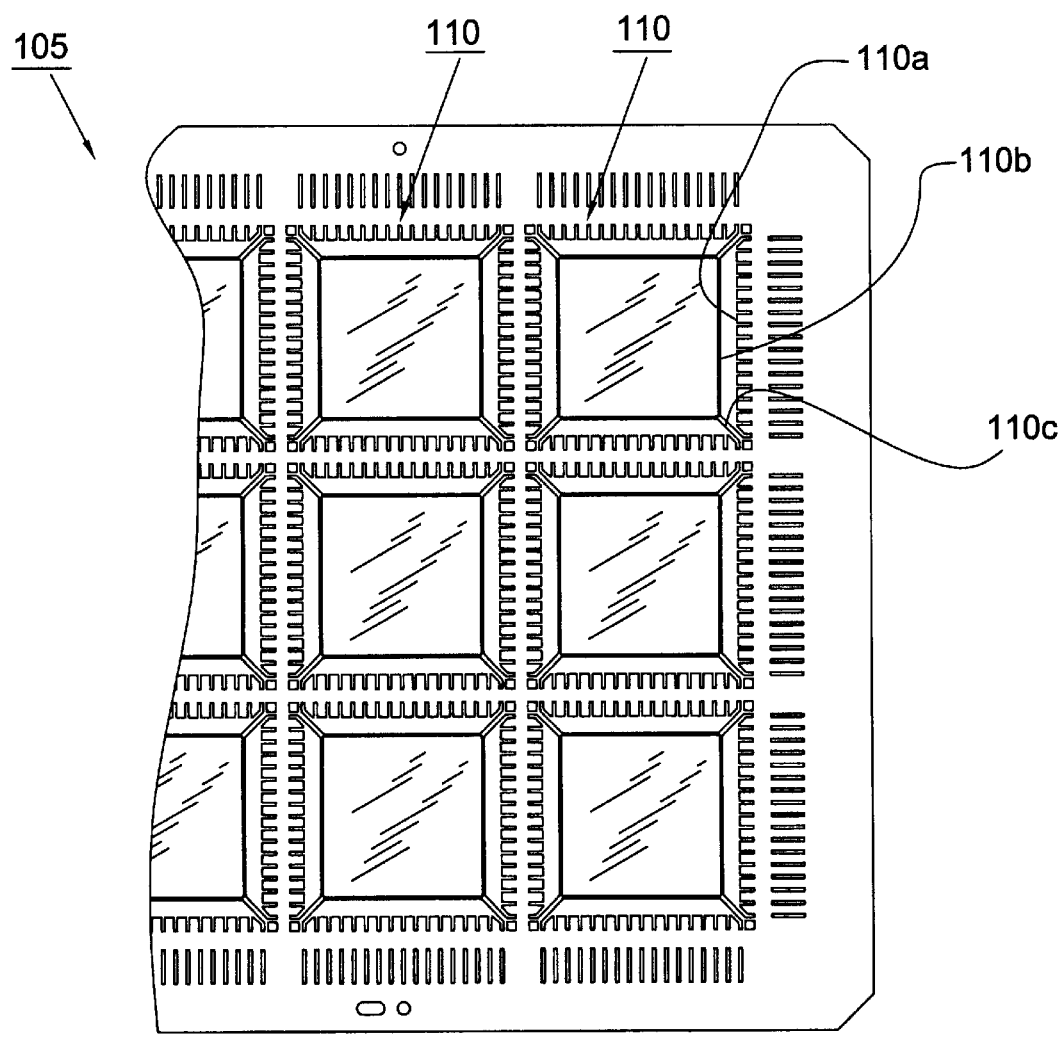
FIG. 2 is a top plan view of a conventional lead frame for use in forming leadless semiconductor packages.
Figure 4:
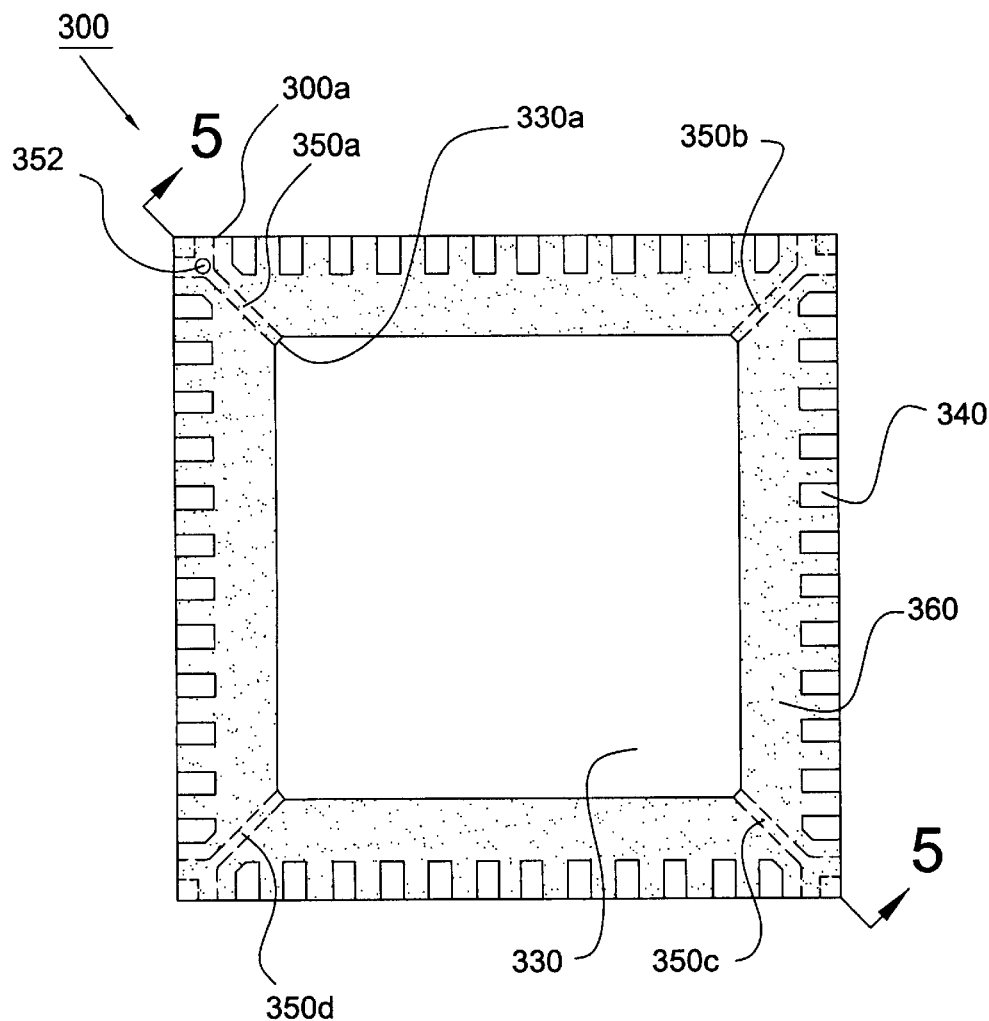
FIG. 4 is a bottom view of a leadless semiconductor package according to a first preferred embodiment of the present invention.
Figure 5:
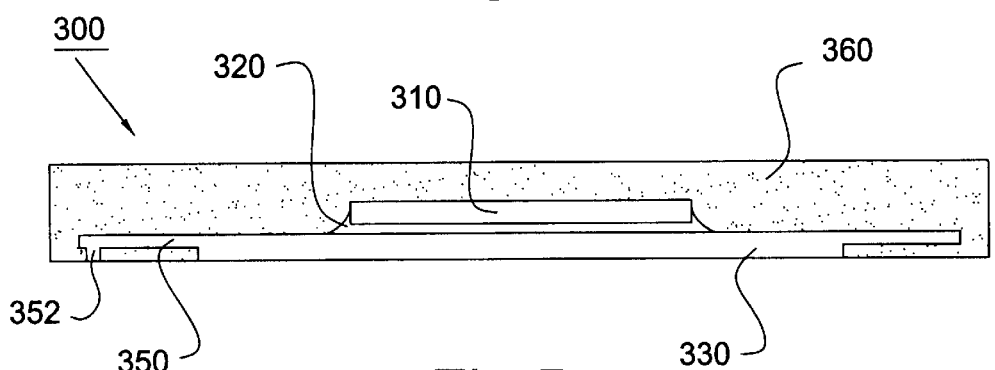
FIG. 5 is a cross sectional view taken from the line 5—5 of FIG. 4 of the present invention.

FIG. 4 and FIG. 5 discloses a leadless semiconductor package 300 in accordance with a first embodiment of the present invention comprising a chip 310 attached to a die pad 330 by a conductive adhesive such as silver paste 320. The active surface of the chip 310 is provided with a plurality of bonding pads electrically connected to leads 340 through bonding wires (not shown). The leads 340 are arranged at the periphery of the die pad 330. There are four tie bars 350a, 350b, 350c, 350d connected to the die pad 330. Each tie bar, such as the tie bar 350a, extends from a corner (such as the corner 330a) of the die pad 330 to a corresponding corner (such as the corner 300a) of the leadless semiconductor package 300. A package body 360 is formed over the semiconductor chip 310, the tie bars and the leads 340. The backside surface of the leads 230 and the die pad 232 is exposed from the bottom of the package body 360.

The leadless semiconductor package 300 is characterized in that all the tie bars 350a, 350b, 350c, 350d are embedded in the package body 360 except that the tie bar 350a has a bulge portion 352 exposed from the bottom of the package 300 to work as an indicial mark. Furthermore, the bulge portion 352 of the tie bar 350a is disposed corresponding to the corner 330a of the leadless semiconductor package 300.

The package 300 can be mounted onto a substrate, such as a printed circuit board (PC board), like other leadless devices. For example, a PC board is screen printed with a solder paste in a pattern which corresponds to the pattern of the leads 340 exposed from the bottom of the package 300. The package 300 is then appropriately positioned on the PC board and the solder is reflowed by using the conventional surface mount technology. Alternatively, the leads 340 exposed from the bottom of the package 300 can be printed with solder paste and then mounted onto the PC board.

Figure 6:
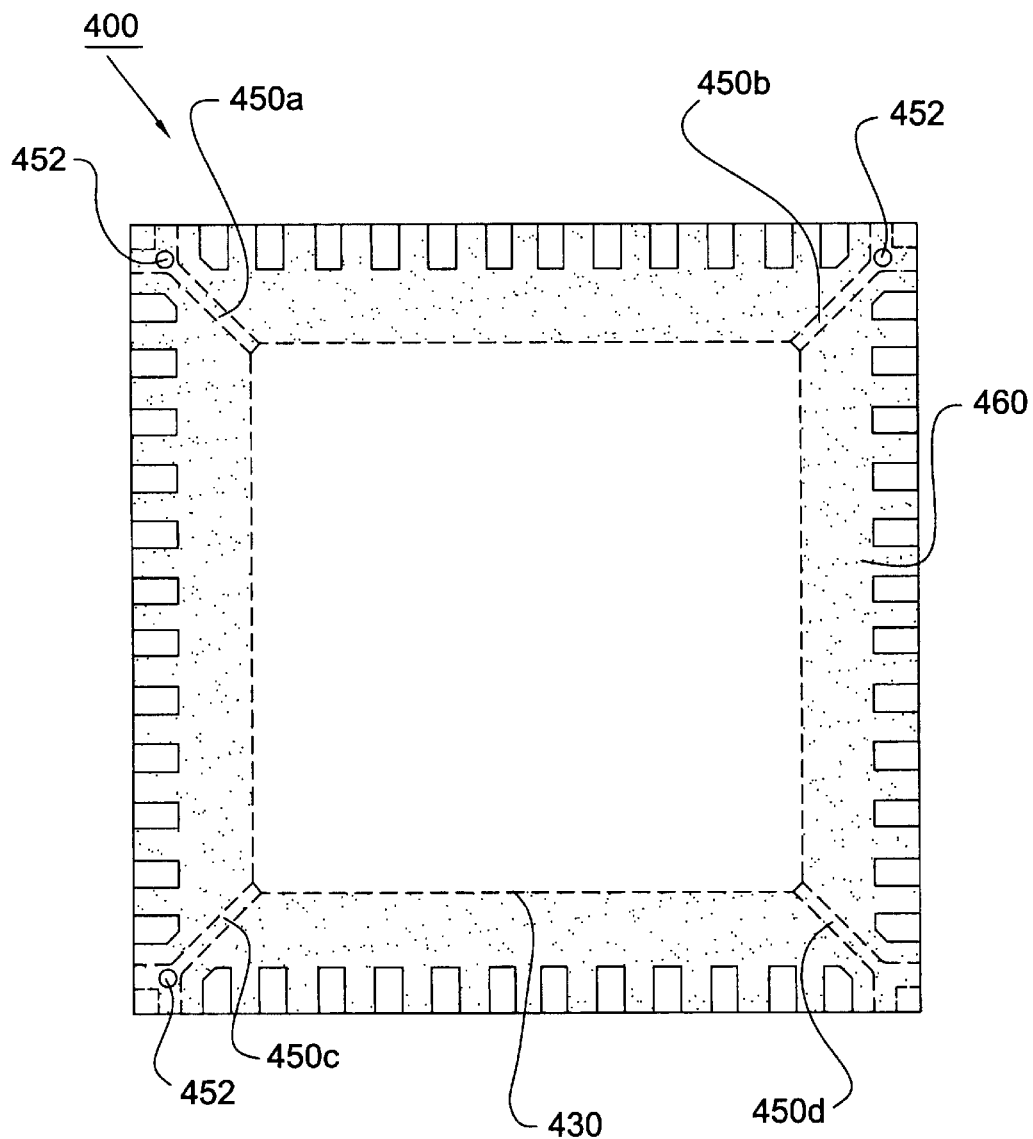
FIG. 6 is a bottom view of a leadless semiconductor package according to a second preferred embodiment of the present invention.

FIG. 6 shows a leadless semiconductor package 400 in accordance with a second embodiment of the present invention. It is noted that an upset process is performed with respect to the tie bars 450a, 450b, 450c, 450d of the lead frame to form stepped portions such that the die pad 430 is positioned higher in level than the leads and embedded in the package body 460. The leadless semiconductor package 400 is characterized in that all the tie bars 350a, 350b, 350c, 350d are embedded in the package body 360 except that the tie bar 350a, 350b, 350c each has a bulge portion 452 exposed from the bottom of the package 400 to work as an indicial mark.

Figure 7:
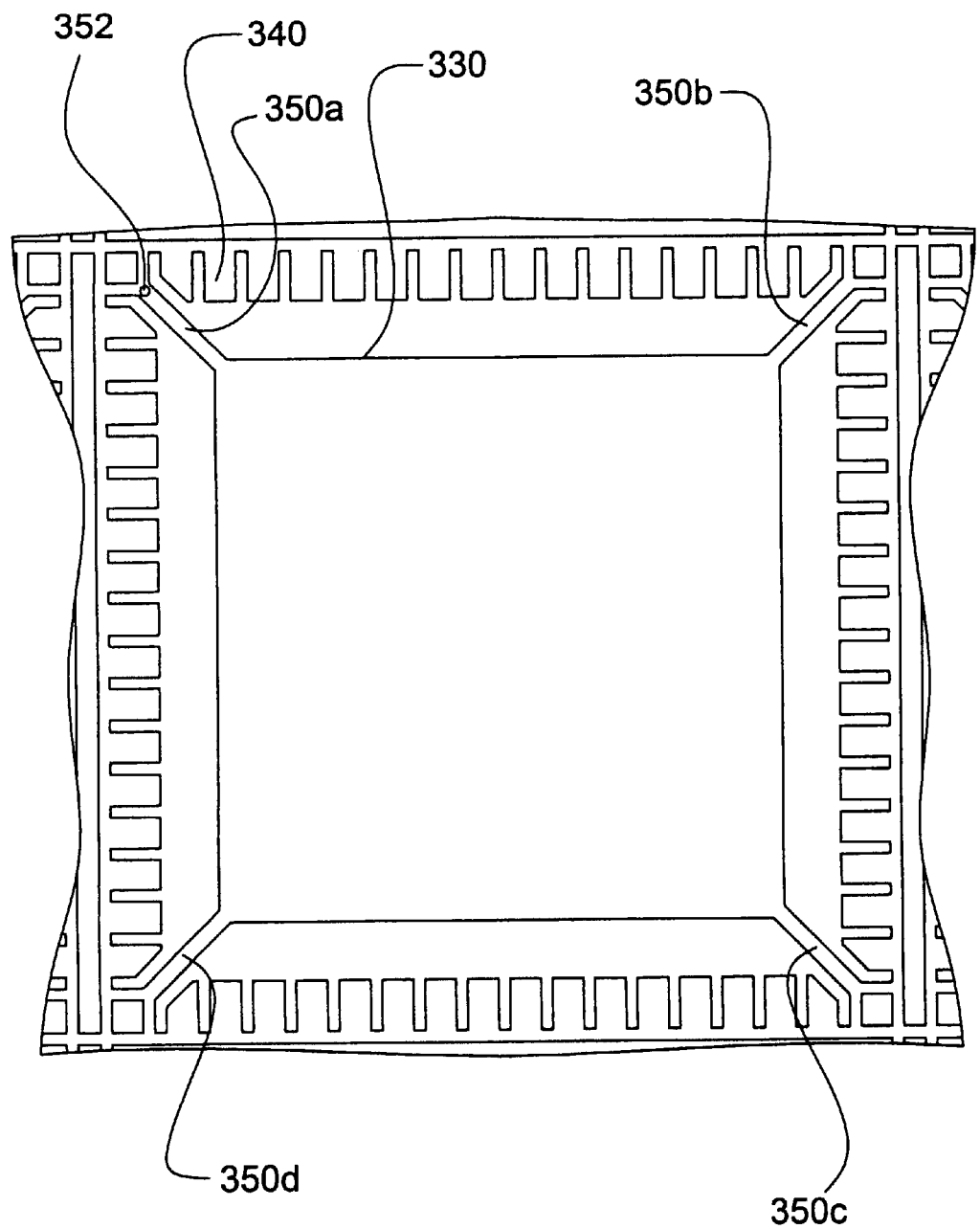
FIG. 7 is a top plan view of a lead frame in accordance with the present invention showing one unit thereof.

FIG. 7 illustrates one unit of a lead frame in accordance with the present invention. In mass production, it is desirable to integrally form a plurality of units in a lead frame having alignment holes (not shown) so that the packaging process (including molding process) can be automated.

In the lead frame of the present invention, each unit includes a die pad 330 adapted for receiving a semiconductor chip and a plurality of leads 340 arranged at the periphery of the die pad 330. Each die pad 340 is connected to the lead frame by four tie bars 350a, 350b, 350c, 350d. All of the tie bars are half-etched except a part of the tie bar 350a such that the thickness of all tie bars is less than the thickness of the die pad 330 and the leads 340 except the unetched part of the tie bar 350a. Preferably, the unetched part of the tie bar 350a forms a bulge portion 352 in order to work as an indicial mark.

According to a preferred embodiment of the present invention, the lead frame is formed from a thin metal strip. Preferably, the thin metal strip is made of copper or alloys containing copper. Alternatively, the thin metal strip may be made of iron, nickel or alloys thereof, and then plated with copper. The lead frame according to the present invention is preferably formed by the method of etching. Firstly, the thin metal strip is degreased, cleaned and polished. Then, areas on the upper surface of the thin metal strip at which it is undesired to be etched are protected by adhesive tapes, e.g., the upper surface of the die pad, the leads and the tie bars. And areas on the lower surface of the strip at which it is undesired to be etched are also protected by adhesive tapes, e.g., the lower surface of the die pad, the leads as well as the bulge portion of some of the tie bars. After that, areas on both surfaces of the metal strip without protection of the adhesive tape are etched. Therefore, in the finished lead frame, the lower surface of all tie bars is half-etched such that the thickness of all tie bars is less than the thickness of the lead frame except the unetched part of some of the tie bars. It is noted that the "half-etching" herein does not mean only exactly removing an half of the thickness of the metal strip through etching but also includes a partial etching for removing merely a part of the thickness of the metal strip. It should be understood that the metal strip may be masked by a photoresist instead of the adhesive tape. Typically, the photoresist is mainly composed of a resin mixture, and a photoactive material that makes the photoresist photodefinable.

The leadframe in accordance with the present invention is very cost-effective because it's fully compatible with the current lead frame fabricating process.

In a preferred embodiment of the present invention, the leadframe is provided with a metal flash on the upper and lower surfaces thereof. Typically, the metal flash comprises a layer of nickel covering the lead frame and a layer of gold (or palladium) covering the nickel layer. The metal flash can help to prevent the die pad and the leads from corrosion or contamination.

Protected by the adhesive tapes during the etching process, a part of at least one tie bar or an odd number of tie bars is unetched so as to form bulge portion that work as an indicial mark after the leadless semiconductor packages are finished. This significantly reduces human error during packaging steps performed before the marking step. Furthermore, the bulge portion of tie bar can work as an indicial mark identified by a recognition system which provides all the coordinates of the leads needed in the following testing or trouble-shooting process.

Although the invention has been explained in relation to its preferred embodiment, it is to be understood that many other possible modifications and variations can be made without departing from the spirit and scope of the invention as hereinafter claimed.

What is claimed is:

1. A semiconductor package having opposing upper and lower surfaces and at least four corners, the semiconductor package comprising:
   a die pad and a plurality of leads arranged at the periphery of the die pad;
   a plurality of tie bars extending from the die pad to the corners of the package;
   a semiconductor chip disposed on the die pad and electrically coupled to the leads; and
   a package body formed over the semiconductor chip, the leads and the tie bars in a manner that the backside surface of the leads is exposed from the lower surface of the semiconductor package,
      wherein all of the tie bars are embedded in the package body except that only one of the tie bars has a part or only an odd number of the tie bars each has a part exposed from the lower surface of the semiconductor package to work as an indicial mark.

2. The semiconductor package as claimed in claim 1, wherein the backside surface of the die pad is exposed from the lower surface of the semiconductor package.

3. The semiconductor package as claimed in claim 1, wherein the exposed part of tie bar is disposed corresponding to one of the corners of the semiconductor package.

4. The semiconductor package as claimed in claim 1, wherein only three of the tie bars each has a part exposed from the lower surface of the semiconductor package.

5. A semiconductor package having opposing upper and lower surfaces and at least four corners, the semiconductor package comprising:
   a die pad and a plurality of leads arranged at the periphery of the die pad;
   a plurality of tie bars extending from the die pad to the corners of the package;
   a semiconductor chip disposed on the die pad and electrically coupled to the leads; and
   a package body formed over the semiconductor chip, the leads and the tie bars in a manner that the backside surface of the leads is exposed from the lower surface of the semiconductor package,
      wherein all the tie bars are half-etched except a part of at least one tie bar or an odd number of tie bars such that all the tie bars are embedded in the package body except the unetched part is exposed from the lower surface of the package body to work as an indicial mark.

6. The semiconductor package as claimed in claim 5, wherein the backside surface of the die pad is exposed from the lower surface of the semiconductor package.

7. The semiconductor package as claimed in claim 5, wherein the unetched part of the bar is disposed corresponding to one of the corners of the semiconductor package.

8. The semiconductor package as claimed in claim 5, wherein at least three tie bars each has an unetched part exposed from the lower surface of the semiconductor package.

9. A lead frame for use in forming semiconductor packages, the lead frame comprising:
   a plurality of units each having four corners,
   each unit including a die pad adapted for receiving a semiconductor chip and a plurality of leads arranged at the periphery of the die pad,
   each die pad being connected to the lead frame by a plurality of tie bars wherein at least one tie bar or an odd number of tie bars each has a bulge portion such that the thickness of all tie bars of each unit is substantially less than the thickness of the lead frame except the bulge portion or bulge portions thereof whereby the bulge portion or bulge portions work as an indicial mark.

10. The lead frame as claimed in claim 9, wherein the indicial mark is adapted to be identified by a recognition system which provides all the coordinates of the leads needed in the testing or trouble-shooting process.

11. The lead frame as claimed in claim 9, wherein the bulge portion or bulge portions are disposed corresponding to the corners of the units of the lead frame.

12. A lead frame for use in forming semiconductor packages, the lead frame comprising:
   a plurality of units each having four corners, each unit including a die pad adapted for receiving a semiconductor chip and a plurality of leads arranged at the periphery of the die pad,
   each die pad being connected to the lead frame by a plurality of tie bars, wherein all of the tie bars are half-etched except a part of at least one tie bar or an odd number of tie bars such that the thickness of all tie bars is less than the thickness of the lead frame except the unetched part of the at least one tie bar or the odd number of tie bars whereby the unetched part thereof work as an indicial mark.

13. The lead frame as claimed in claim 12, wherein the indicial mark is adapted to be identified by a recognition system which provides all the coordinates of the leads needed in the testing or trouble shooting process.

14. The lead frame as claimed in claim 12, wherein the unetched part of the at least one tie bar or the odd number of tie bars is disposed corresponding to the corners of the units of the lead frame.

* * * * *